United States Patent
Kao et al.

(10) Patent No.: US 8,962,392 B2
(45) Date of Patent: Feb. 24, 2015

(54) UNDERFILL CURING METHOD USING CARRIER

(75) Inventors: Chin-Fu Kao, Taipei (TW); Jing-Cheng Lin, Chu Tung Zhen (TW); Jui-Pin Hung, Hsinchu (TW); Szu Wei Lu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 249 days.

(21) Appl. No.: 13/418,868

(22) Filed: Mar. 13, 2012

(65) Prior Publication Data

US 2013/0244378 A1 Sep. 19, 2013

(51) Int. Cl.
*H01L 21/50* (2006.01)
*H01L 21/56* (2006.01)

(52) U.S. Cl.
CPC ............ *H01L 21/563* (2013.01); *H01L 21/568* (2013.01); *H01L 2224/73204* (2013.01); *H01L 2224/16225* (2013.01)
USPC ........... 438/118; 438/127; 156/311; 257/790; 257/E21.503

(58) Field of Classification Search
CPC ........... H01L 2224/16225; H01L 2224/73204; H01L 21/563; H01L 21/568
USPC .................. 438/108, 109, 118, 127; 156/311; 257/778, 790, E21.503
See application file for complete search history.

(56) References Cited

U.S. PATENT DOCUMENTS

| | | | |
|---|---|---|---|
| 4,811,082 A | 3/1989 | Jacobs et al. | |
| 4,929,486 A * | 5/1990 | Itou et al. | 428/77 |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,450,283 A * | 9/1995 | Lin et al. | 361/704 |
| 5,481,133 A | 1/1996 | Hsu | |
| 5,841,193 A * | 11/1998 | Eichelberger | 257/723 |
| 6,002,177 A | 12/1999 | Gaynes et al. | |
| 6,104,093 A * | 8/2000 | Caletka et al. | 257/778 |
| 6,117,797 A * | 9/2000 | Hembree | 438/759 |
| 6,130,116 A * | 10/2000 | Smith et al. | 438/127 |
| 6,187,678 B1 | 2/2001 | Gaynes et al. | |
| 6,214,640 B1 * | 4/2001 | Fosberry et al. | 438/106 |
| 6,224,711 B1 * | 5/2001 | Carden et al. | 156/311 |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,436,223 B1 * | 8/2002 | Edwards et al. | 156/288 |
| 6,448,661 B1 | 9/2002 | Kim et al. | |
| 6,461,895 B1 | 10/2002 | Liang et al. | |
| 6,486,001 B1 * | 11/2002 | Ohshima et al. | 438/108 |
| 6,488,806 B2 * | 12/2002 | Carden et al. | 156/311 |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |

(Continued)

*Primary Examiner* — Mary Wilczewski

(74) *Attorney, Agent, or Firm* — Lowe Hauptman & Ham, LLP

(57) ABSTRACT

A method includes bonding a carrier over a top die. The method further includes curing an underfill disposed between a substrate and the top die. The method further includes applying a force over the carrier during the curing. The method further includes removing the carrier from the top die.

20 Claims, 2 Drawing Sheets

(56) References Cited

U.S. PATENT DOCUMENTS

| | | | |
|---|---|---|---|
| 6,699,731 B2* | 3/2004 | Huang et al. | 438/108 |
| 6,703,299 B2* | 3/2004 | Shi et al. | 438/612 |
| 6,762,076 B2 | 7/2004 | Kim et al. | |
| 6,784,530 B2* | 8/2004 | Sugaya et al. | 257/686 |
| 6,790,748 B2 | 9/2004 | Kim et al. | |
| 6,838,313 B2* | 1/2005 | Kumamoto et al. | 438/106 |
| 6,870,258 B1* | 3/2005 | Too | 257/704 |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,931,725 B2* | 8/2005 | Sugaya et al. | 29/852 |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,018,866 B2* | 3/2006 | Sugaya et al. | 438/108 |
| 7,037,804 B2 | 5/2006 | Kellar et al. | |
| 7,056,807 B2 | 6/2006 | Kellar et al. | |
| 7,087,458 B2* | 8/2006 | Wang et al. | 438/108 |
| 7,087,538 B2 | 8/2006 | Staines et al. | |
| 7,129,119 B2* | 10/2006 | Lin et al. | 438/113 |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,348,211 B2* | 3/2008 | Lin et al. | 438/106 |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,619,901 B2* | 11/2009 | Eichelberger et al. | 361/763 |
| 7,663,254 B2* | 2/2010 | Hara | 257/790 |
| 7,687,314 B2* | 3/2010 | Takeuchi et al. | 438/108 |
| 7,687,810 B2* | 3/2010 | Mo et al. | 257/79 |
| 7,728,440 B2 | 6/2010 | Honda | |
| 7,733,655 B2* | 6/2010 | Beaumier et al. | 361/719 |
| 7,759,784 B2* | 7/2010 | Ono et al. | 257/688 |
| 7,834,450 B2 | 11/2010 | Kang | |
| 7,880,317 B2* | 2/2011 | Ohde et al. | 257/787 |
| 7,892,883 B2* | 2/2011 | Kostiew et al. | 438/106 |
| 8,021,964 B2* | 9/2011 | Akiyama et al. | 438/460 |
| 8,183,092 B2* | 5/2012 | Huang et al. | 438/113 |
| 8,455,991 B2* | 6/2013 | Hsiao et al. | 257/678 |
| 8,524,538 B2* | 9/2013 | Lee et al. | 438/115 |
| 2005/0224953 A1* | 10/2005 | Lee et al. | 257/704 |
| 2005/0233547 A1* | 10/2005 | Noda et al. | 438/459 |
| 2007/0296079 A1* | 12/2007 | Huang et al. | 257/712 |
| 2009/0206519 A1* | 8/2009 | Hou | 264/299 |
| 2010/0233867 A1* | 9/2010 | Akiyama et al. | 438/464 |
| 2011/0129963 A1* | 6/2011 | Kostiew et al. | 438/118 |
| 2013/0244378 A1* | 9/2013 | Kao et al. | 438/118 |

* cited by examiner

UNDERFILL CURING METHOD USING CARRIER

TECHNICAL FIELD

The present disclosure relates generally to an integrated circuit and more particularly to an underfill curing method.

BACKGROUND

In underfill curing of a flip chip package, a high temperature during processing can induce warpage of the flip chip package. Due to a cross-link chemical reaction of underfills after a full curing process, the warpage can be increasing to around 1000 μm or more in some cases. High warpage not only causes high internal stress, high warpage will also become a challenge for wafer handling during a following process. For example, the high warpage can result in a die cracking issue during a molding compound grinding process.

BRIEF DESCRIPTION OF THE DRAWINGS

Reference is now made to the following descriptions taken in conjunction with the accompanying drawings.

DETAILED DESCRIPTION

Figure 1A:
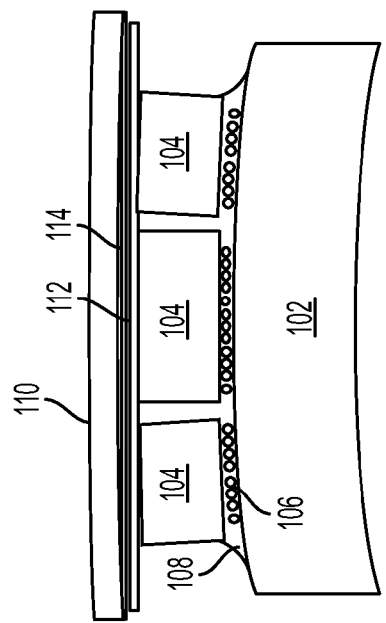
FIGS. 1A-1D are schematic diagrams of intermediate steps of an exemplary underfill curing method using a carrier according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1D are schematic diagrams of intermediate steps of an exemplary underfill curing method using a carrier according to some embodiments. In FIG. 1A, an underfill 108 material is dispensed between a substrate 102 and top dies 104. The substrate can be, for example, a silicon substrate, an interposer, or any other suitable support structure. Solder bumps 106 electrically interconnect the substrate 102 and the top dies 104. The solder bumps 106 can be micro bumps, ball grid array (BGA) solder balls, or any other suitable structure, and can comprise Sn, Ag, Cu, or any other suitable material known in the art.

The underfill 108 can comprise a polymer material having a silica filler, or any other suitable non-conductive material. The underfill 108 protects the solder bumps 106 from moisture or other environmental hazards, and provides additional mechanical strength to a package assembly. Also, the underfill 108 may help to compensate for thermal expansion difference between the top dies 104 and the substrate 102 to prevent breaking or damage of the electrical connection of the solder bumps 106. The underfill 108 can be needle-dispensed along the edges of each top die 104, for example.

Figure 1B:
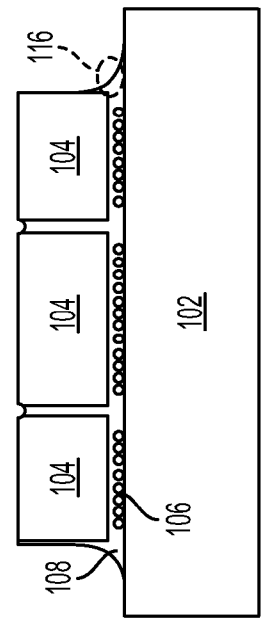

In FIG. 1B, a carrier (or board) 110 is placed over top dies 104 and bonded together using an adhesive layer 112. The adhesive layer 112 can comprise glue-type or film-type materials. A force (or pressure) is applied over the carrier 110 to fix the top dies 104 while the underfill 108 is cured by a thermal process. The force ranges from about 1000 N to about 8000 N in some embodiments.

A coefficient of thermal expansion (CTE) of the carrier 110 is greater than the CTE of the substrate 102. The carrier 110 comprises glass and the substrate 102 comprises silicon, for example. The carrier 110 can be a pure material or a complex material which has the CTE mismatch from the substrate 102. In some embodiments, the carrier 110 comprises glass, stainless steel, or any other suitable material. The carrier 110 has a thickness of about 500 μm-1000 μm in some embodiments.

The adhesive layer 112 can be formed over the top dies 104 by coating, e.g., spin coating and/or laminating under the carrier 110. In some embodiments, a release layer 114 is applied (formed) under the carrier 110. The adhesive layer 112 and/or the release layer 114 can comprise multiple layers in some embodiments. In one example, the carrier 110 is treated with a light-to-heat conversion (LTHC) coating for the release layer 114. The thermal process for curing the underfill 108 can be a multi-step process lasting from about 30 min to about 20 hours with temperatures ranging from about 80° C. to about 200° C. in some embodiments. In one example, the thermal process has 16 steps for 13 hours, with each step lasting from 10 min to 3 hours at temperatures ranging from 80° C. to 150° C., then cooling down to about 30° C.

Figure 1C:
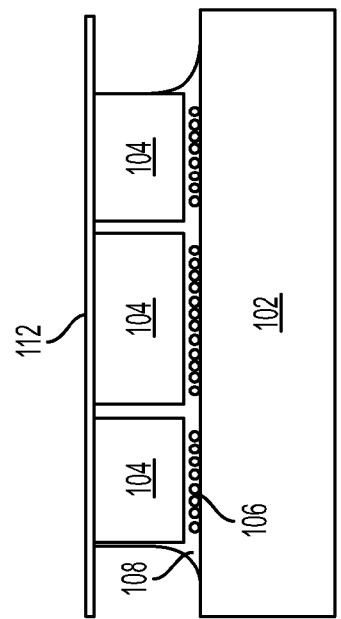

In FIG. 1C, the carrier 110 shown in FIG. 1B is removed from the top dies 104. In some embodiments using LTHC as the release layer 114, a laser is used to heat and decompose the release layer 114 prior to removing the carrier 110. The carrier 110 can be recycled and reused. The release layer 114 can be also triggered by illuminating using ultra violet (UV) light and/or a thermal process in some embodiments.

Figure 1D:
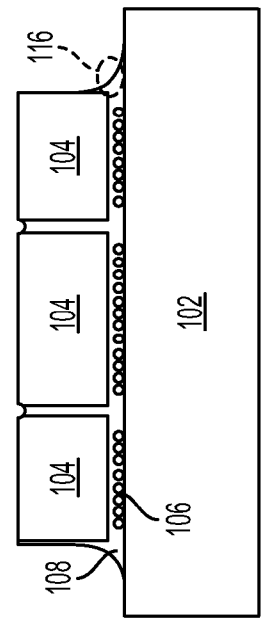

In FIG. 1D, the adhesive layer 112 shown in FIG. 1C is removed from the top dies 104. In some embodiments, the cleaning is performed using a wet clean process using suitable solvents. In other embodiments, the adhesive layer 112 is peeled off using a wafer tape (not shown) after removing the carrier 110 from the top dies 104.

By using the method shown in FIGS. 1A-1D, the warpage of the package during underfill curing process can be controlled in a non-destructive manner. Temporary bonding of the carrier 110 and the package including the substrate 102 and the top dies 104 during the underfill 108 curing process reduces warpage of the package from shrinkage of underfill 108 by using the CTE mismatch between the carrier 110 and the substrate 102. The adhesive layer 112 may also help to fill the gap between top dies 104 to reduce the warpage and an underfill filet 116.

Figure 2:
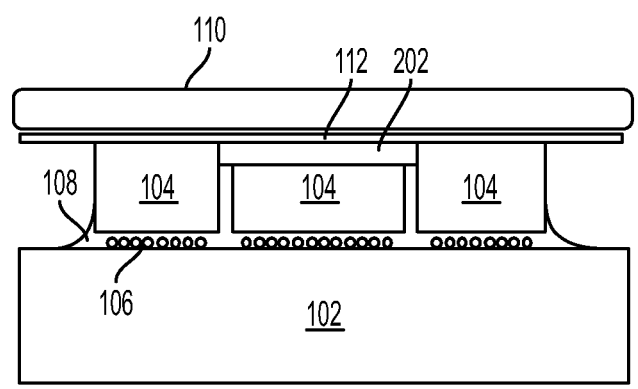
FIG. 2 is a schematic diagram of another intermediate step of the exemplary underfill curing method using a carrier according to some embodiments.

In one example, a package not using the method in FIGS. 1A-1D has a warpage of about 1159 μm when the top die 104 thickness is 700 µm. In comparison, a package using the method shown in FIGS. 1A-1D (with the same top die thickness of 700 µm) has a warpage ranging from about 472 µm and about 398 µm, when using a carrier 110 with a CTE of 4 µm·m$^{-1}$ K$^{-1}$ and 7 µm·m$^{-1}$ K$^{-1}$, respectively (the adhesive layer 112 thickness is about 10 µm). The CTE of the substrate 102 is about 3 µm·m$^{-1}$ K$^{-1}$ in this example. Also, the warpage is about 273 µm in another example using the methods shown in FIGS. 1A-1D, when the top die 104 thickness is between about 100 µm and about 750 µm, such as about 350 µm, the adhesive layer 112 thickness is 50 µm, and the carrier 110 has a CTE of 9 µm·m$^{-1}$ K$^{-1}$. The top dies 104 can have the same height as shown in FIGS. 1A-1D, or they can have different heights as shown in FIG. 2. Also, the top dies 104 can have various patterns and thicknesses.

FIG. 2 is a schematic diagram of an intermediate step of the exemplary underfill curing method using a carrier according to some embodiments. The package in FIG. 2 is similar to the package in FIG. 1B except that the top dies 104 in FIG. 2 do not have the same height. A space 202 between the carrier 110 and the top die 104 can result from the height difference. The method shown in FIG. 1A-1D can still be applied when the top dies 104 have different heights in order to reduce the warpage during the underfill 108 curing process.

According to some embodiments, a method includes bonding a carrier over a top die. An underfill disposed between a substrate and the top die is cured. A force is applied over the carrier during the curing process. The carrier is removed from the top die.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   bonding a carrier over a top die;
   forming an adhesive layer over the top die or under the carrier, wherein a space exists between the adhesive layer and a top surface of the top die, and the top surface of the top die extends parallel to a surface of the carrier closest to the top die;
   curing an underfill disposed between a substrate and the top die;
   applying a force over the carrier during the curing; and
   removing the carrier from the top die.

2. The method of claim 1, wherein a coefficient of thermal expansion (CTE) of the carrier is greater than a CTE of the substrate.

3. The method of claim 1, further comprising dispensing the underfill between the top die and the substrate.

4. The method of claim 1, further comprising cleaning the adhesive layer after removing the carrier from the top die.

5. The method of claim 4, wherein the cleaning is performed using a wet clean process.

6. The method of claim 1, wherein the adhesive layer is peeled off using a wafer tape after removing the carrier from the top die.

7. The method of claim 1, further comprising applying a release layer to the carrier.

8. The method of claim 7, wherein the release layer comprises a light to heat conversion (LTHC) material.

9. The method of claim 7, further comprising decomposing the release layer using a laser prior to removing the carrier.

10. The method of claim 1, wherein the force ranges from about 1000 N to about 8000 N.

11. The method of claim 1, wherein the curing is performed at a temperature ranging from about 80° C. to about 200° C.

12. The method of claim 1, wherein the curing is performed for a time period ranging from about 30 minutes to about 20 hours.

13. The method of claim 1, wherein forming the adhesive layer comprises forming the adhesive layer having a bottom surface above the top surface of the top die.

14. A method, comprising:
   bonding a carrier over a top die;
   forming an adhesive layer over the top die or under the carrier, wherein a space exists between the adhesive layer and a top surface of the top die, and the top surface of the top die extends parallel to a surface of the carrier closest to the top die;
   dispensing an underfill between the top die and a substrate wherein a coefficient of thermal expansion (CTE) of the carrier is greater than a CTE of the substrate;
   curing the underfill;
   applying a force over the carrier during the curing;
   applying a release layer to the carrier wherein the release layer comprises a light to heat conversion (LTHC) material; and
   removing the carrier from the top die.

15. The method of claim 14, further comprising:
   cleaning the adhesive layer after removing the carrier from the top die.

16. The method of claim 14, wherein the cleaning is performed using a wet clean process.

17. The method of claim 14, wherein the adhesive layer is peeled off using a wafer tape after removing the carrier from the top die.

18. The method of claim 14, further comprising decomposing the release layer using a laser prior to removing the carrier.

19. The method of claim 14, wherein forming the adhesive layer comprises forming the adhesive layer to be spaced from a top surface of the top die.

20. A method, comprising:
   applying a release layer to a carrier wherein the release layer comprises a light to heat conversion (LTHC) material;
   forming an adhesive layer over a top die;
   bonding the carrier over the top die;
   dispensing an underfill between the top die and a substrate wherein a coefficient of thermal expansion (CTE) of the carrier is greater than a CTE of the substrate;

curing the underfill;
applying a force over the carrier during the curing;
decomposing the release layer using a laser, an ultra violet (UV) light exposure, or a thermal process;
removing the carrier from the top die; and
cleaning the adhesive layer after removing the carrier from the top die.

* * * * *